US006657132B2

(12) United States Patent
James

(10) Patent No.: US 6,657,132 B2
(45) Date of Patent: Dec. 2, 2003

(54) SINGLE SIDED ADHESIVE TAPE FOR COMPOUND DIVERSION ON BOC SUBSTRATES

(75) Inventor: Stephen L. James, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/808,156

(22) Filed: Mar. 15, 2001

(65) Prior Publication Data

US 2002/0129973 A1 Sep. 19, 2002

(51) Int. Cl.[7] .................................................. H05K 1/16
(52) U.S. Cl. ......................................... 174/260; 29/841
(58) Field of Search .......................... 74/260; 361/760, 361/783; 257/667; 29/841

(56) References Cited

U.S. PATENT DOCUMENTS

| | | | |
|---|---|---|---|
| 5,789,803 A | * | 8/1998 | Kinsman ..................... 257/666 |
| 6,124,629 A | * | 9/2000 | Murakami et al. ........... 257/666 |
| 6,159,764 A | * | 12/2000 | Kinsman et al. ............. 438/106 |
| 6,285,558 B1 | * | 9/2001 | Frantz et al. ................ 257/690 |

* cited by examiner

*Primary Examiner*—David L. Talbott
*Assistant Examiner*—Jeremy Norris
(74) *Attorney, Agent, or Firm*—Dickstein Shapiro Morin & Oshinsky LLP

(57) ABSTRACT

An adhesive system and a method of adhesion for a ball grid array semi-conductor device package facilitate the encapsulation of a die attached to a circuit board. A material is added between a die and a circuit board tape, and is oriented perpendicular to a conventional two-piece tape system used to attach the die to the circuit board. The material, which is located across from a gate through which an encapsulation compound is injected to form a package, acts as a diversion dam. The material thereby enables the injected encapsulation compound to fill a wirebond slot last and avoid an overflow which might otherwise damage the ball grid array.

30 Claims, 5 Drawing Sheets

SINGLE SIDED ADHESIVE TAPE FOR COMPOUND DIVERSION ON BOC SUBSTRATES

BACKGROUND OF THE INVENTION

I. Field of the Invention

The present invention relates generally to semiconductor die packaging. More particularly, the present invention relates to an adhesive system and method for encapsulation of a die attached to a circuit board.

II. Description of the Related Art

A board-on-chip (BOC) is a semiconductor integrated circuit (IC) device where the die and the circuit board are attached and encapsulated as one package. The die and board are typically attached, prior to encapsulation, by double sided adhesive tape applied to the bottom of the board and top of the die. The die is also electrically connected to the board by wirebonds. The then attached die and board are completely encapsulated (packaged) for protection with a compound, such as plastic. The compound is injected into a mold and onto the die and board at a high pressure in a hot molten liquid form. The compound then cools and hardens to form a protective package. The encapsulation process is complex because a desired exterior surface of the board, containing the ball grid arrays (BGA), must only be partially sealed with the compound used for encapsulation. In particular, the wirebonds on the exterior surface of the board must be sealed with the encapsulating compound but the compound cannot contact the ball grid arrays. If the compound contacts the balls of a ball grid array the device will be damaged because the connectivity of the board to external circuits will be negatively effected.

FIGS. 1(a)–1(c) illustrate a conventional BOC package 100 with FIG. 1(a) showing a side view. In a conventional BOC package 100, the board 102 is physically attached to the die 104 by two pieces of double sided adhesive tape 106, 108 placed in between the die 104 and board 102. The die 104 is electrically connected to the board 102 by wirebonds 110 which pass through a wirebond slot 112 in board 102. The wirebonds 110 are all physically located between the two pieces of adhesive tape 106, 108 in the wirebond slot 112.

During encapsulation the compound must fill the wirebond slot 112 and cover all wirebonds 110 on the board 102, but the compound must not flow beyond the edges of the ball grid arrays 114, 116. FIG. 1(b) illustrates a top view of the conventional BOC package 100 and provides a clear depiction of the ball grid arrays 118, 122, the edges of the ball grid arrays 114, 116, and the wirebond slot 112.

FIG. 1(c) illustrates a cross sectional view of the BOC package along line A—A of FIG. 1(a) (the area between the die 104 and board 102). Referring to FIG. 1(c), during encapsulation the compound is introduce into the BOC package under high pressure at the gate 120. The compound then begins to fill a mold containing the die 104 and encapsulates the BOC package 100 in the direction of arrows 140–148. In this conventional BOC package 100 the wirebond slot 112 may fill before the compound has completely encapsulated the entire die 104. Thus, the compound may begin to flow up and over the top of the board 102 and past the edges of the ball grid arrays 114, 116 before the die 104 is encapsulated. As described above, when the compound contacts the ball grid arrays 118, 122 the BOC package will be damaged.

The foregoing problems of encapsulation of a BOC package are undesirable aspects of conventional semiconductor packaging techniques. A system and method are needed to better encapsulate a BOC package such that the ball grid array will not be damaged during encapsulation.

SUMMARY OF THE INVENTION

The present invention provides an efficient adhesive tape system and method for a BOC package which allows for better encapsulation. The present invention adds a small piece of material, for example, adhesive tape, oriented perpendicular to the conventional two-piece tape system used to attached a die to a circuit board. The material is located in front of the gate of the BOC package during encapsulation to form a diversion dam thereby causing a compound during encapsulation to fill the wirebond slot last. By filling the wirebond slot last, the present invention prevents overflow of the compound, thus ensuring that the ball grid arrays will not be damaged.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

Figure 1A:
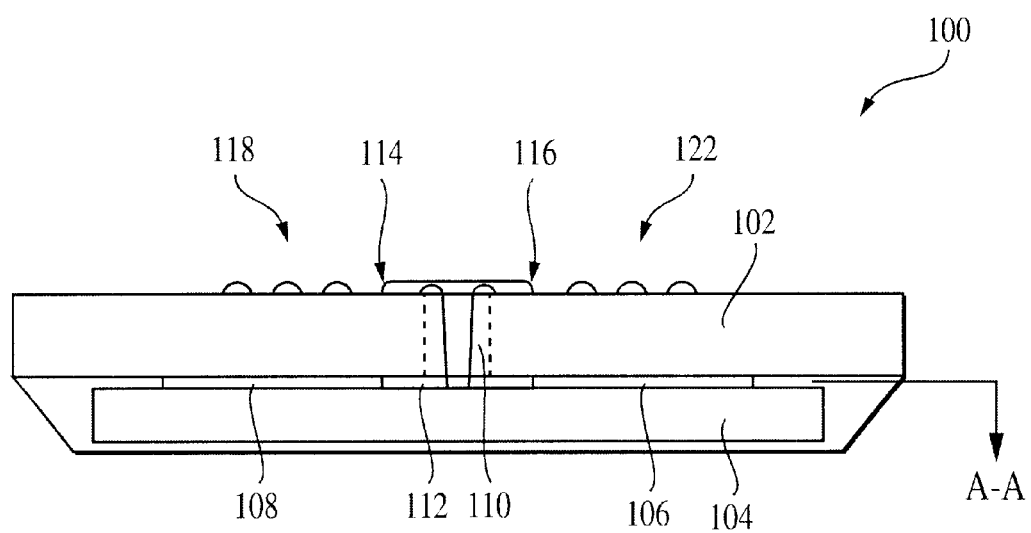
FIG. 1(a) is a side view of a conventional BOC package.
Figure 1B:
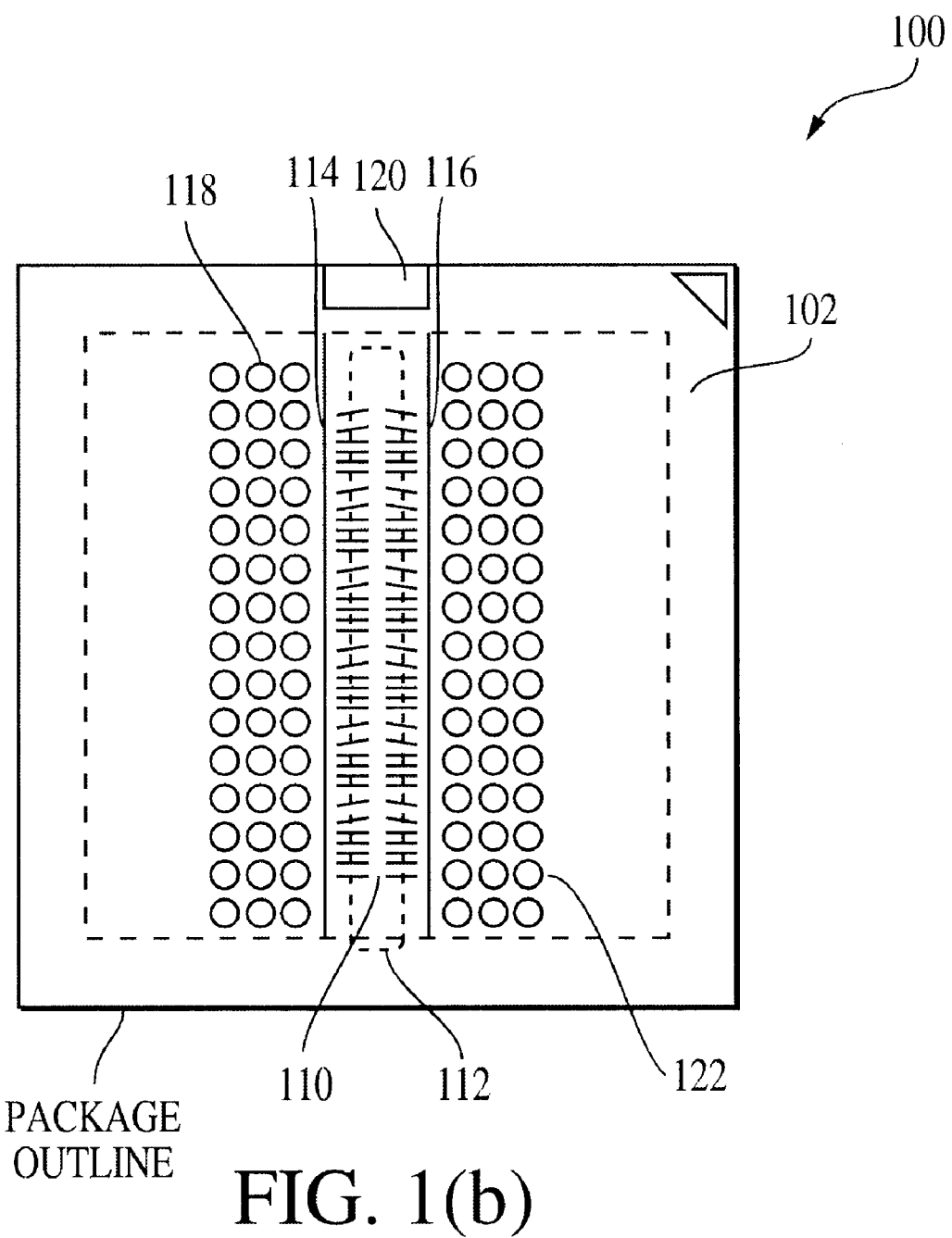
FIG. 1(b) is a top view of a conventional BOC package.
Figure 1C:
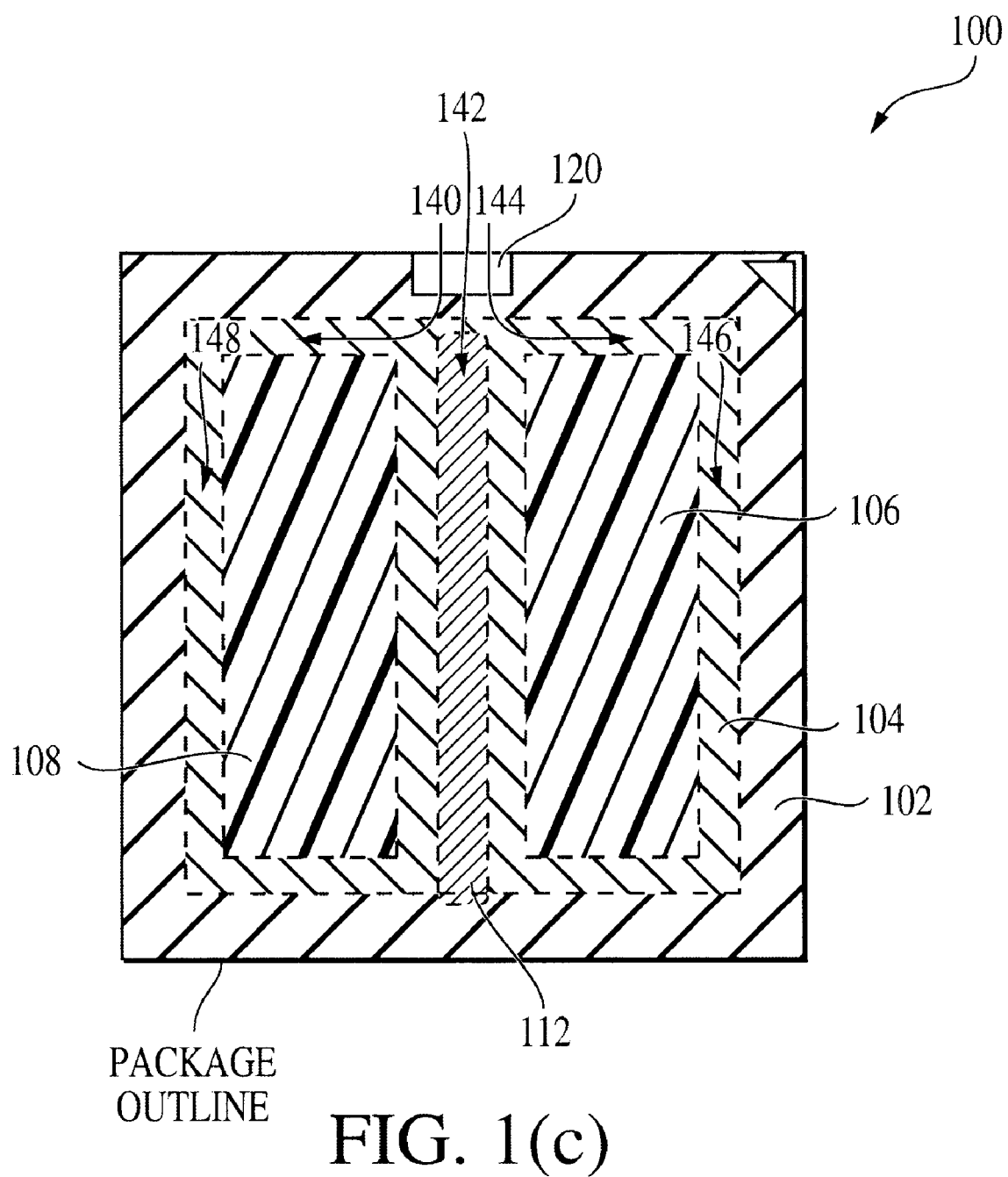
FIG. 1(c) is a cross sectional view of the area between the die and circuit board of a conventional BOC package.
Figure 2:
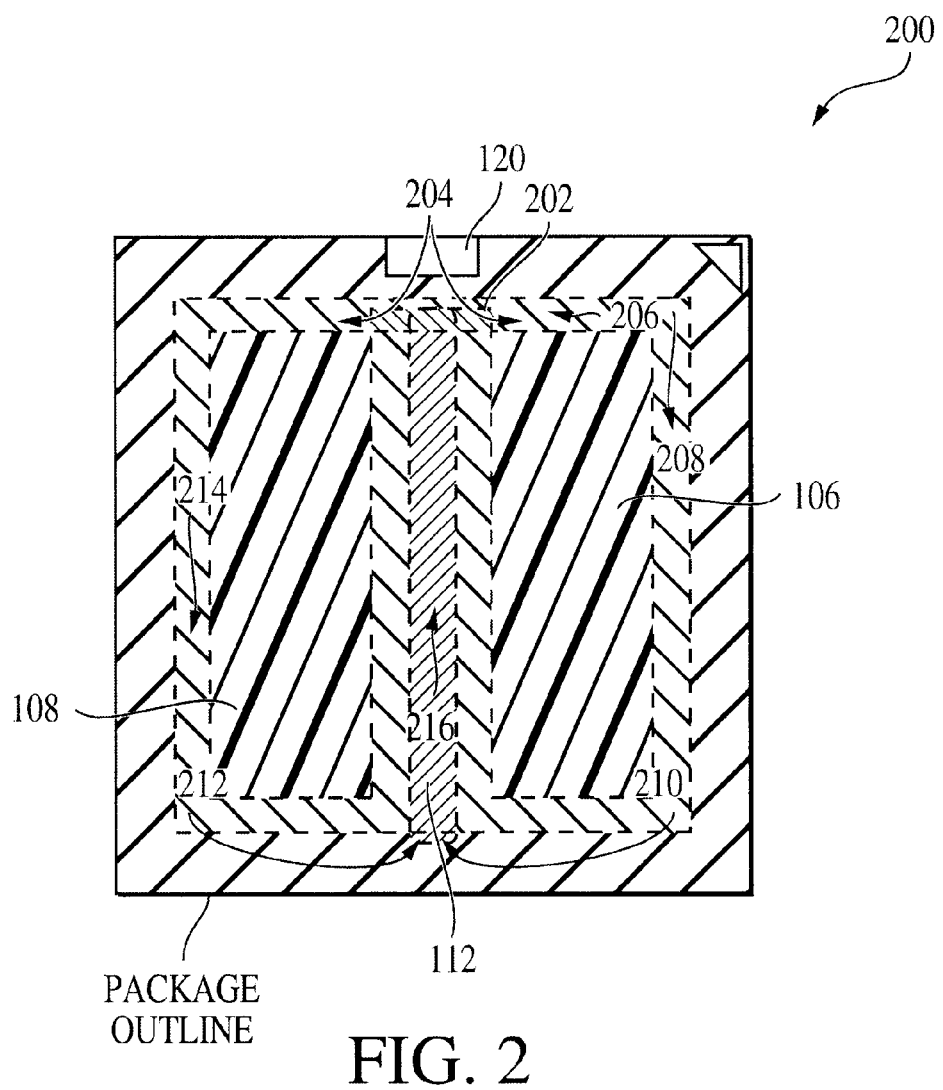
FIG. 2 is a cross sectional view of the area between the die and circuit board of the present invention.

Referring now to the drawings, where like reference numerals designate like elements, there is shown in FIG. 2 an improved BOC package 200 which during encapsulation allows for encapsulation without overflow onto the ball grid array. Improved BOC package 200 includes the conventional two-piece double-sided adhesive 106, 108 used to attach the die 104 to the board 102 prior to encapsulation. To aid in encapsulation, the improved BOC package adds a smaller third piece of material, for example, adhesive tape 202 perpendicular to the two pieces of double sided adhesive 106, 108 to block the wirebond slot 112 on the side of the wirebond slot 112 closest to the gate 120. The material 202 thereby forms a diversion dam to divert the compound from filling the wirebond slot 112 before encapsulating the die 104 during encapsulation. The material 202 if formed as a third piece of tape need only have adhesive on one side because the material 202 is not needed to aid in attaching the pre-encapsulated die 104 to the board 102 since the two piece double sided adhesive 106, 108 are adequate for attachment.

During encapsulation, the material 202 diverts the infused compound from the wirebond slot 112 such that the compound first fills the area surrounding the bottom of the die 104 (opposite the side of gate 120), then fills the area surrounding the perimeter of the die 104 and thereafter the wirebond slot 112 is filled with the compound as illustrated by directional arrows 204–216. Thus, since the wirebond slot 112 is the last portion of the improved BOC package 200 to become encapsulated, no overflow exists to damage the ball grid arrays.

Figure 3:
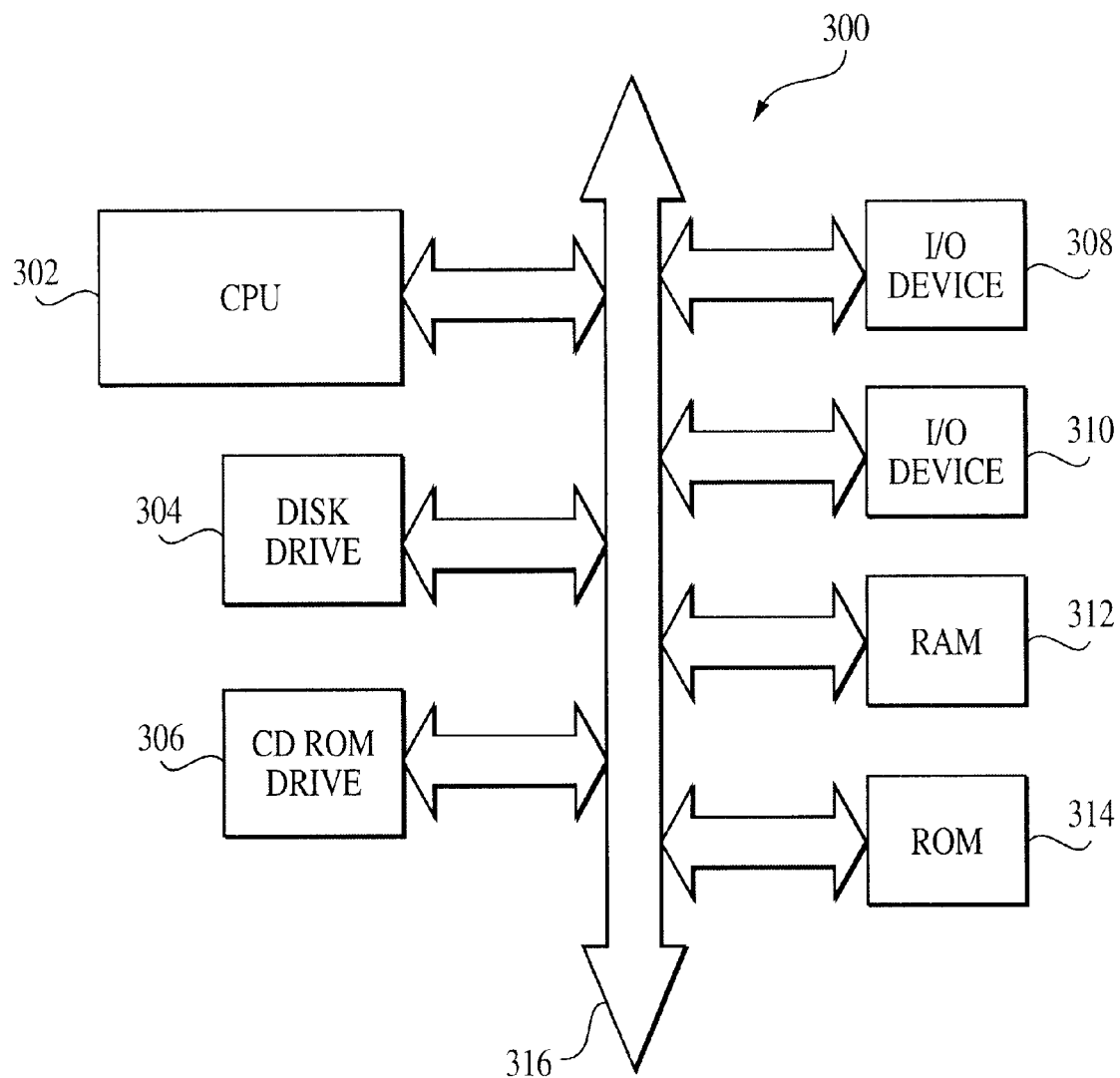
FIG. 3 illustrates a processor system including a semiconductor package employing the adhesive tape system and method of the present invention.

FIG. 3 illustrates a simplified processor system 300 which may employ die and circuit boards employing the BOC package of the present invention as described and illustrated with reference to FIG. 2. Processor system 300 includes central processing unit (CPU) 302, RAM and ROM memories 312, 314, input/output (I/O) devices 308, 310, disk drive 304 and CD ROM drive 306 All of the above components communicate with each other over bus structure 316, which may include one or more buses. The CPU 302 or memories 312, 314 may use the improved BOC package of the present invention as described and illustrated with reference to FIG. 2 to encapsulate the BOC package without damaging the ball grid arrays. RAM memory devices 312 and CPU 302 may also be integrated together on a single chip. In addition, one or more dedicated RAM memory devices may be encapsulate to form the improved BOC package and then a plurality of such packaged devices may be arranged in a memory module.

While an exemplary embodiment of the invention has been described and illustrated, it is to be understood that the above description is intended to be illustrative and not restrictive. Many variations to the above-described system and method will be readily apparent to those having ordinary skill in the art. For example, a single-sided or double-sided piece of adhesive tape may be used as the diversion material. Further, instead of using adhesive tape for the diversion dam a thin layer of other material can be deposited between the die and circuit board, where the thin layer of material has sufficient heating characteristics to maintain its form during encapsulation.

Also, although the invention has been described with reference to use of double sided tape to secure a die to a circuit board, the invention can be implemented with two stripes of any type of adhesive material which can suitable fasten the die and circuit board together.

Accordingly, the present invention is not to be considered as limited by the specifics of the particular system and method which have been described and illustrated, but is only limited by the scope of the appended claims.

What is claimed as new and desired to be protected by Letters Patent of the United States is:

1. A die mounting structure comprising:
    a die;
    a circuit board containing a wirebond slot;
    a first piece of double side adhesive tape secured between said die and said circuit board, said first piece of tape being parallel to a length of said wirebond slot, said first piece of tape residing on a first side of said wirebond slot;
    a second piece of double side adhesive tape secured between said die and said circuit board, said second piece of tape being parallel to said length of said wirebond slot in said circuit board; said second piece of tape residing on a second of said wirebond slot; and
    a third piece of tape perpendicular to said first and second pieces of doubled sided tape, said third piece of tape contacting said first and second pieces of doubled sided tape to form an encapsulated diversion dam.

2. The structure of claim 1, where said third piece of tape is a single sided adhesive tape.

3. The structure of claim 1, wherein said third piece of tape is provided at a location adapted to face an inlet for an encapsulation compound.

4. The structure of claim 1, wherein said third piece of tape resides on said die.

5. The structure of claim 1, wherein said third piece of tape resides on said circuit board.

6. The structure of claim 1, wherein said die includes a memory device.

7. The structure of claim 1, wherein said die includes a processor.

8. A structure for use in a semiconductor package, said structure comprising:
    a first adhesive material provided between a die and a circuit board, said first adhesive material in parallel to a length of a wirebond slot in said circuit board, said first adhesive material residing on a first side of said wirebond slot;
    a second adhesive material provided between said die and said circuit board, said second adhesive material in parallel to said length of said wirebond slot in said circuit board; said second adhesive material residing on a second side of said wirebond slot; and
    a third material provided on said circuit board and extending between said first and second materials to form a diversion dam for an encapsulation material, wherein said third material is an adhesive tape.

9. The structure of claim 8, wherein said first material is an adhesive tape.

10. The structure of claim 9, wherein said adhesive tape is a double sided adhesive tape.

11. The structure of claim 8, wherein said second material is an adhesive tape.

12. The structure of claim 11, wherein said adhesive tape is a double sided adhesive tape.

13. The structure of claim 11, wherein said adhesive tape is a single sided adhesive tape.

14. The structure of claim 8, wherein said third material is a thin layer of material applied to one or both of said die and said circuit board, at a location adapted to face an inlet for an encapsulation compound.

15. The structure of claim 8, wherein said third material resides on said die.

16. The structure of claim 8, wherein said third material resides on said circuit board.

17. The structure of claim 8, wherein said die is a memory die.

18. A processor system comprising:
    a memory; and
    a processor coupled to said memory, at least one of said processor and said memory being in the form of a die which is coupled to a circuit board by an adhesive system, said adhesive system comprising:
        a first adhesive material provided between said die and said circuit board, said first adhesive material being in parallel to a length of a wirebond slot in said circuit board, said first adhesive material residing on a first side of said wirebond slot;
        a second adhesive material provided between said die and said circuit board, said second adhesive material being in parallel to said length of said wirebond slot in said circuit board; said second adhesive material residing on a second side of said wirebond slot; and
        a third material provided on said circuit board and extending between said first and second materials to form a diversion dam for an encapsulation material, wherein said third material is an adhesive tape.

19. The system of claim 18, wherein said first material is an adhesive tape.

20. The system of claim 19, wherein said adhesive tape is a double sided adhesive tape.

21. The system of claim 18, wherein said second material is an adhesive tape.

22. The system of claim 21, wherein said adhesive tape is a double sided adhesive tape.

23. The system of claim 18, wherein said adhesive tape is a single sided adhesive tape.

24. The system of claim 18, wherein said third material is a thin layer of material applied to one or both of said die and said circuit board at a location adapted to face an inlet for an encapsulation compound.

25. The system of claim 18, wherein said third material resides on said die.

26. The system of claim 18, wherein said third material resides on said circuit board.

27. The system of claim 18, wherein said die is a memory die.

28. A method of encapsulating a semiconductor package, said method comprising:
   securing a first adhesive material between a die and a circuit board, said first adhesive material extending in parallel to a length of a wirebond slot in said circuit board, said first adhesive material residing on a first side of said wirebond slot;
   securing a second adhesive material between said die and said circuit board, said first adhesive material extending in parallel to said length of said wirebond slot in said circuit board, said first adhesive material residing on a second side of said wirebond slot;
   securing a third material between said die and said circuit board and extending between said first and second adhesive materials, wherein said step of securing said third material comprises securing said third material on said die; and
   injecting a compound into a gate, said compound being directed by said third material to fill said wirebond slot last.

29. The method of claim 28, wherein said step of securing said third material comprises applying a thin layer of material on said die, said thin layer of material contacting said first and second adhesive materials to form a diversion dam.

30. The method of claim 28, wherein said step of securing said third material comprises applying a thin layer of material on said circuit board, said thin layer of material contacting said first and second adhesive materials to form a diversion dam.

* * * * *